(12) United States Patent
Chen et al.

(10) Patent No.: US 11,417,629 B2
(45) Date of Patent: Aug. 16, 2022

(54) THREE-DIMENSIONAL STACKING STRUCTURE AND MANUFACTURING METHOD THEREOF

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/787,031

(22) Filed: Feb. 11, 2020

(65) Prior Publication Data

US 2021/0249380 A1    Aug. 12, 2021

(51) Int. Cl.
| | |
|---|---|
| *H01L 25/065* | (2006.01) |
| *H01L 23/48* | (2006.01) |
| *H01L 23/00* | (2006.01) |
| *H01L 23/31* | (2006.01) |
| *H01L 21/78* | (2006.01) |
| *H01L 21/56* | (2006.01) |
| *H01L 25/00* | (2006.01) |

(52) U.S. Cl.
CPC ........ *H01L 25/0652* (2013.01); *H01L 21/565* (2013.01); *H01L 21/78* (2013.01); *H01L 23/3128* (2013.01); *H01L 23/481* (2013.01); *H01L 24/08* (2013.01); *H01L 24/89* (2013.01); *H01L 24/94* (2013.01); *H01L 25/50* (2013.01); *H01L 2224/08146* (2013.01); *H01L 2224/80895* (2013.01); *H01L 2224/80896* (2013.01); *H01L 2225/06544* (2013.01); *H01L 2225/06565* (2013.01); *H01L 2225/06586* (2013.01)

(58) Field of Classification Search
CPC ....... H01L 25/0657; H01L 2225/06541; H01L 2224/16145; H01L 2224/80895; H01L 25/0652; H01L 23/49827
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Bradley Smith
*Assistant Examiner* — David J Goodwin
(74) *Attorney, Agent, or Firm* — JCIPRNET

(57) ABSTRACT

A stacking structure including a first die, a second die stacked on the first die, and a third die and a fourth die disposed on the second die. The first die has a first metallization structure, and the first metallization structure includes first through die vias. The second die has a second metallization structure, and second metallization structure includes second through die vias. The first through die vias are bonded with the second through die vias, and sizes of the first through die vias are different from sizes of the second through die vias. The third and fourth dies are disposed side-by-side and are bonded with the second through die vias.

16 Claims, 17 Drawing Sheets

(56) References Cited

U.S. PATENT DOCUMENTS

| | | | |
|---|---|---|---|
| 9,461,018 B1 | 10/2016 | Tsai et al. | |
| 9,496,189 B2 | 11/2016 | Yu et al. | |
| 9,564,420 B2* | 2/2017 | Yu | H01L 25/50 |
| 9,589,913 B1* | 3/2017 | Shepard | H01L 25/50 |
| 9,666,502 B2 | 5/2017 | Chen et al. | |
| 9,735,131 B2 | 8/2017 | Su et al. | |
| 9,741,694 B2* | 8/2017 | Yu | H01L 25/50 |
| 9,929,149 B2* | 3/2018 | Sinha | H01L 24/73 |
| 9,935,081 B2* | 4/2018 | Pan | H01L 24/81 |
| 10,354,980 B1* | 7/2019 | Mushiga | H01L 25/0657 |
| 10,510,629 B2* | 12/2019 | Chen | H01L 23/3107 |
| 11,049,834 B2* | 6/2021 | Wang | H01L 27/11568 |
| 2015/0235949 A1* | 8/2015 | Yu | H01L 21/76802 |
| | | | 257/774 |
| 2015/0318246 A1* | 11/2015 | Yu | H01L 25/065 |
| | | | 257/774 |
| 2017/0194291 A1* | 7/2017 | Yu | H01L 23/3185 |
| 2019/0378820 A1* | 12/2019 | Gao | H01L 21/76898 |

* cited by examiner

THREE-DIMENSIONAL STACKING STRUCTURE AND MANUFACTURING METHOD THEREOF

BACKGROUND

High-density integration of various device dies and/or components is highly developed. One approach for high-density integration is three-dimensional stacking, also called three-dimensional integration, of different devices and components at the wafer level. The three-dimensional stacking structures offer higher density of interconnects, decreased length of interconnects or volume reduction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
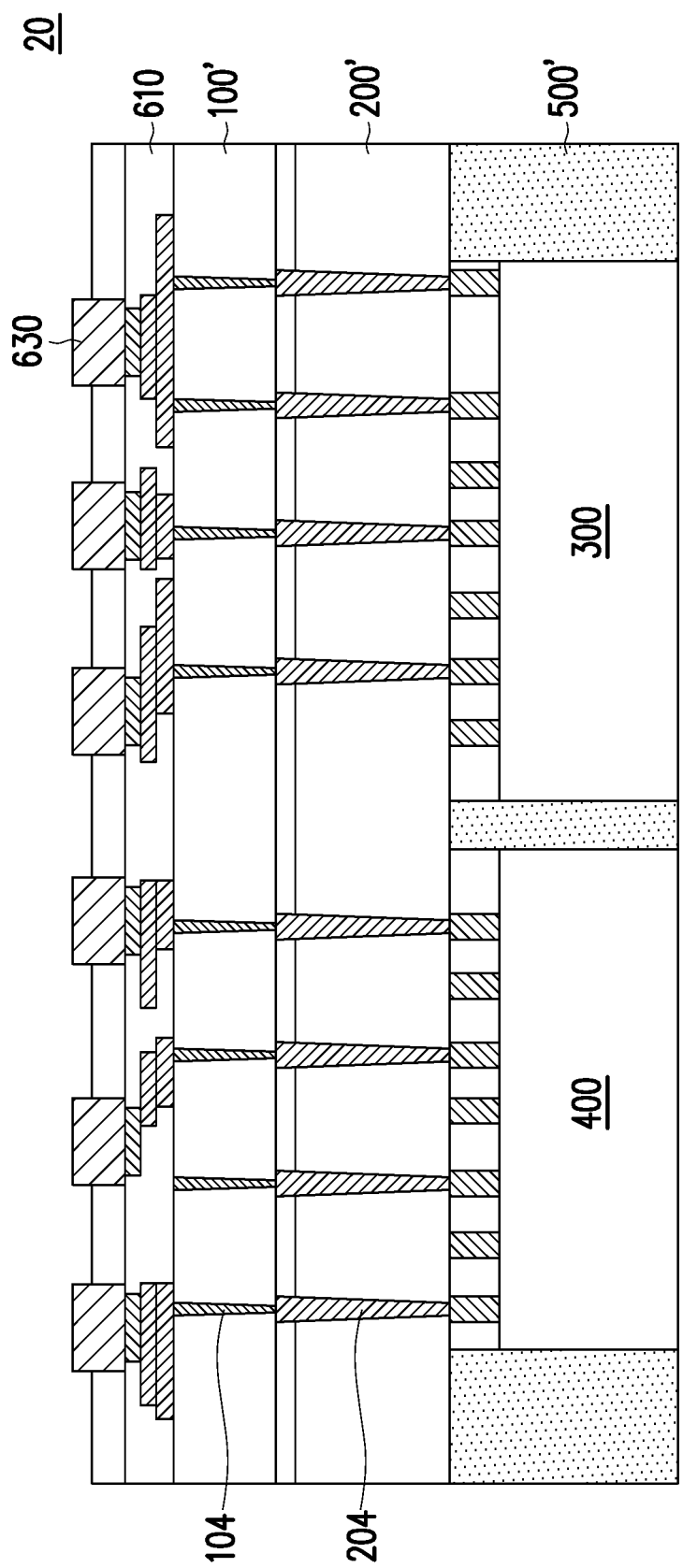
FIG. 1 is a perspective view of a portion of an exemplary three-dimensional stacking structure in accordance with some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the three-dimensional (3D) packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the present disclosure provides applicable concepts that can be embodied in a wide variety of specific contexts. The specific embodiment(s) discussed herein is merely illustrative and is related to a three-dimensional (3D) integration structure or assembly, and does not limit the scope of the present disclosure. Embodiments of the present disclosure describe the exemplary manufacturing process of 3D stacking structures and the 3D stacking structures fabricated there-from. Certain embodiments of the present disclosure are related to the 3D stacking structures formed with wafer bonding structures and stacked wafers and/or dies. Other embodiments relate to 3D integration structures or assemblies including post-passivation interconnect (PPI) structures or interposers with other electrically connected components, including wafer-to-wafer assembled structures, die-to wafer assembled structures, package-on-package assembled structures, die-to-die assembled structures, and die-to-substrate assembled structures. The wafers or dies may include one or more types of integrated circuits or electrical components on a bulk semiconductor substrate or a silicon/germanium-on-insulator substrate. The embodiments are intended to provide further explanations but are not used to limit the scope of the present disclosure.

FIG. 1 illustrates a cross-sectional view of a portion of an exemplary 3D stacking structure in accordance with some embodiments of the present disclosure. In FIG. 1, the 3D stacking structure 20 comprises at least a first die 100', a second die 200', a third die 300, a fourth die 400 and an encapsulant 500'. In some embodiments, the first die 100' includes first metallization structures 104. In some embodiments, the second die 200' includes second metallization structures 204. The first die 100' is stacked on a first side of the second die 200', and the first metallization structures 104 are connected with the corresponding second metallization structures 204. The first die 100' is hybrid-bonded with the second die 200'. In one embodiment, the third die 300 and the fourth die 400 are stacked on a second side of the second die 200' opposite to the first side. The third die 300 and the fourth die 400 are electrically connected with the second die 200' and the first die 100'. The third die 300 and the fourth die 400 are hybrid-bonded with the second die 200'. The 3D stacking structure 20 further comprises a redistribution layer (RDL) 610 disposed on the first die 100' and posts 630 located on the RDL 610.

Figure 2A:
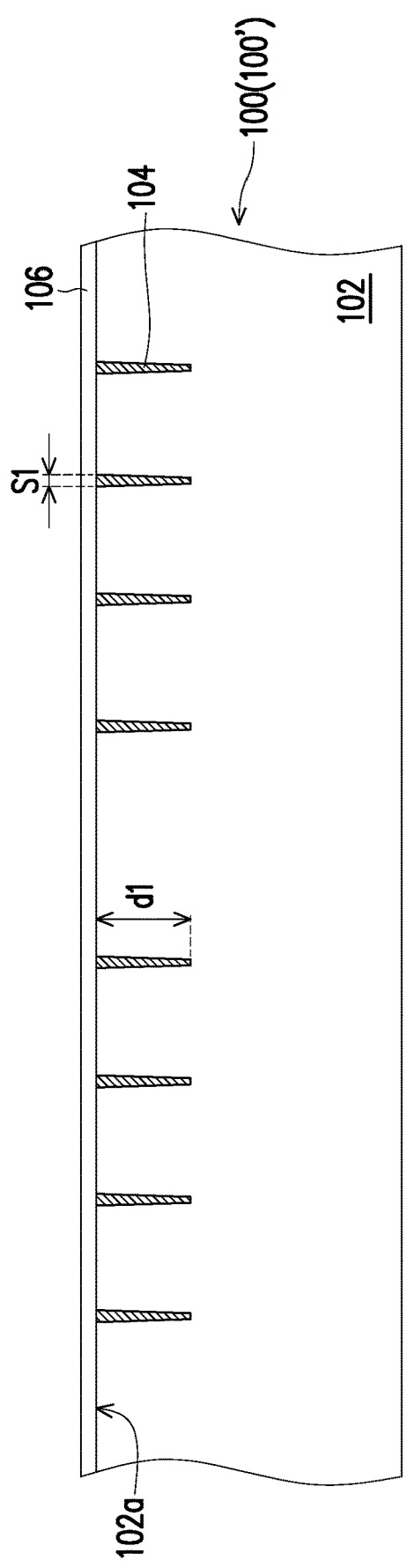
FIGS. 2A-2H are cross-sectional views showing various stages of the manufacturing method for forming the three-dimensional stacking structure according to some embodiments of the present disclosure.

FIGS. 2A-2H illustrate the cross-sectional views showing various stages of the manufacturing methods for forming the 3D stacking structure according to some embodiments of the present disclosure. In FIG. 2A, in some embodiments, a first wafer 100 is provided, and the first wafer 100 includes first metallization structures 104 formed in a first semiconductor substrate 102 and a first bonding film 106 covering the semiconductor substrate 102 and the first metallization structures 104. In some embodiments, the first wafer 100 is a semiconductor wafer made of silicon (such as a silicon bulk wafer) or other semiconductor materials, such as III-V semiconductor materials. In some embodiments, the material of the first bonding film 106 includes silicon oxide, silicon nitride, undoped silicate glass material or a combination thereof. In some embodiment, the bonding film may be formed through performing a chemical vapor deposition (CVD) process such as low-pressure CVD (LPCVD), plasma enhanced CVD (PECVD), and high-density plasma CVD (HDPCVD). In addition, the first wafer 100 may further includes semiconductor devices (not shown) and isolation structures (not shown). In some embodiments, the first wafer 100 includes a plurality of first dies 100' (only one is shown in FIG. 2A). It is understood that the number of the first dies 100' is merely exemplary, and the first dies 100' may be the same type of dies or different type of dies. In certain embodiments, the semiconductor devices may be formed in the semiconductor wafer 100 during the front-end-of-line (FEOL) processes. In certain embodiments, the semiconductor devices are transistors, memories or power devices, or other devices such as capacitors, resistors, diodes, photo-diodes, sensors or fuses. In exemplary embodiments, some of the semiconductor devices may be electrically connected with the first metallization structures 104.

As shown in FIG. 2A, in certain embodiments, the first metallization structures 104 are through substrate vias (TSVs) embedded within the semiconductor substrate 102. In some embodiments, the first metallization structures 104 include metal vias, having a critical dimension S1 and extending from the top surface 102a (contact surface of the substrate 102 and the bonding film 106) of the substrate 102 into a first depth d1 of the semiconductor substrate 102. In one embodiment, the metal vias have tilted sidewalls and have a shape of truncated cones. In one embodiment, the metal vias have substantially vertical sidewalls and have a shape of cylinders. In some embodiments, the depth (length) d1 of the first metallization structures 104 ranges from about 20 microns to 30 microns. In some embodiments, the critical dimension S1 of the first metallization structures 104 ranges from about 0.5 microns to about 5 microns. In some embodiments, the critical dimension S1 of the first metallization structures 104 is about 1-2 microns. In some embodiments, the first metallization structures 104 may be metal vias having an aspect ratio of about 5-10. In certain embodiments, the materials of the metallization structures 104 include aluminum (Al), aluminum alloy, copper (Cu), copper alloys, tungsten (W), or combinations thereof.

Figure 2B:
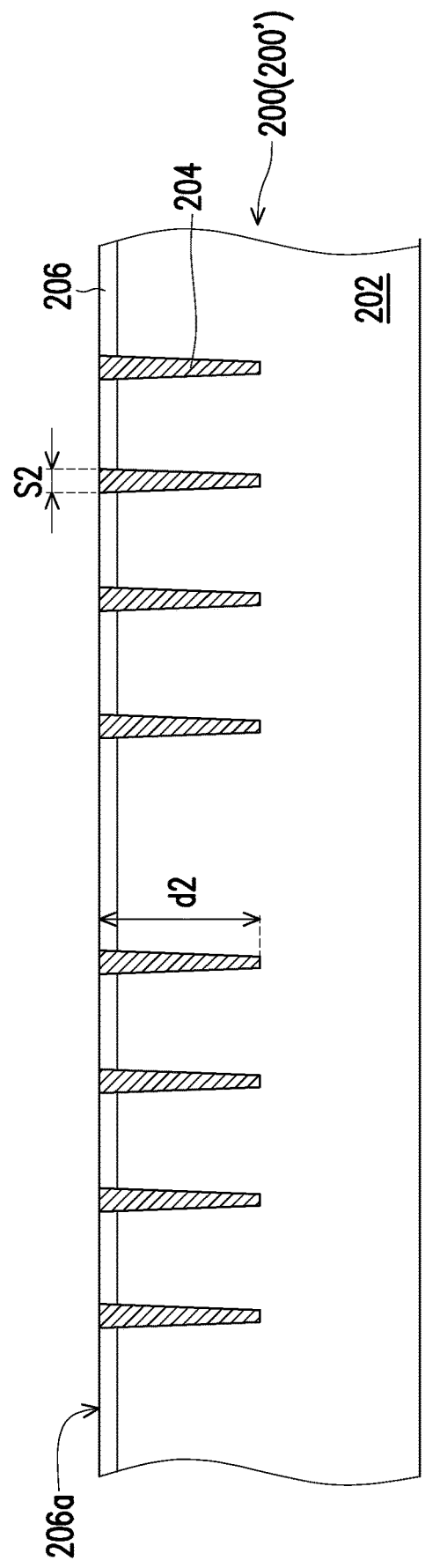

In FIG. 2B, in some embodiments, a second wafer 200 is provided, and the second wafer 200 includes second metallization structures 204 formed in a second semiconductor substrate 202 and a second bonding film 206 covering the semiconductor substrate 202. In some embodiments, the material of the second bonding film 206 includes silicon oxide, silicon nitride, undoped silicate glass material or a combination thereof. In some embodiment, the bonding film may be formed through performing a chemical vapor deposition (CVD) process such as low-pressure CVD (LPCVD), plasma enhanced CVD (PECVD), and high-density plasma CVD (HDPCVD). In some embodiments, the second metallization structures 204 are not covered but exposed from the second bonding film 206. In some embodiments, the second wafer 200 is a semiconductor wafer similar to the first wafer 100. In some embodiments, the second wafer 200 is a different type of wafer from the first wafer 100. In some embodiments, the second wafer 200 is a bulk silicon wafer, and the second wafer 200 may function as an interposer or a structural support. In certain embodiments, the second wafer 200 may further includes semiconductor devices (not shown) and isolation structures (not shown). In some embodiments, the second wafer 200 includes a plurality of second dies 200' (only one is shown in FIG. 2B). It is understood that the number of the second dies 200' is merely exemplary, and the second dies 200' may be the same type of dies as the first dies 100' or different type of dies from the first dies 100'. In exemplary embodiments, if the wafer 200 has semiconductor devices therein, some of the semiconductor devices may be electrically connected with the second metallization structures 204.

In some embodiments, the first dies 100' and the second dies 200' have different functions. In some embodiments, the first dies 100' and the second dies 200' have the same functions. In some embodiments, the first die 100' or the second die 200' includes a memory chip such as a high bandwidth memory chip, a dynamic random access memory (DRAM) chip or a static random access memory (SRAM) chip. In some alternative embodiments, the first die 100' or the second die 200' includes an application-specific integrated circuit (ASIC) chip, an analog chip, a sensor chip, a wireless application chip such as a Bluetooth chip and a radio frequency chip or a voltage regulator chip.

As shown in FIG. 2B, in certain embodiments, the second metallization structures 204 are through substrate vias (TSVs) embedded within the semiconductor substrate 202. In some embodiments, the second metallization structures 204 include metal vias, having a critical dimension S2 and extending from the top surface 206a of the bonding film 206 into a second depth d2 of the semiconductor substrate 202. In one embodiment, the metal vias have tilted sidewalls and have a shape of truncated cones. In one embodiment, the metal vias have substantially vertical sidewalls and have a shape of cylinders. In some embodiments, the second metallization structures 204 may be metal vias having an aspect ratio of about 5-10. In some embodiments, the critical dimension S2 of the second metallization structures 204 ranges from about 1.0 micron to about 10 microns. In some embodiments, the critical dimension S2 of the second metallization structures 204 is about 4-6 microns. In certain embodiments, the critical dimension S2 of the second metallization structures 204 is larger than the critical dimension S1 of the first metallization structures 104. In some embodiments, the depth (length) d2 of the second metallization structures 204 ranges from about 30 microns to 40 microns. In certain embodiments, the material of the second metallization structures 204 is the same as that of the first metallization structures 104. In certain embodiments, the material of the second metallization structures 204 is different from that of the first metallization structures 104.

Figure 2C:
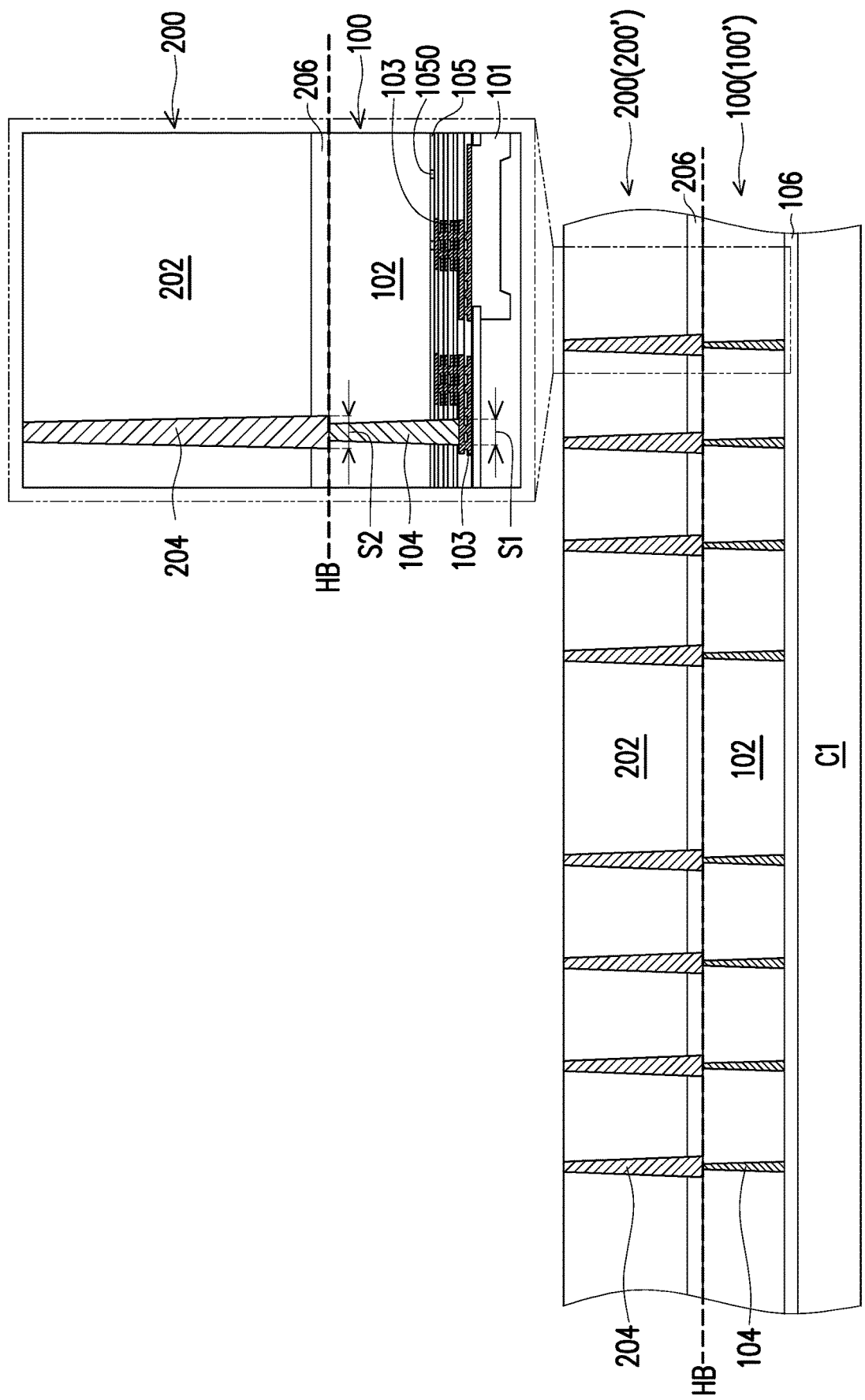

As shown in FIG. 2C, the first wafer 100 is flipped (turned upside down) and placed on a carrier C1 with the bonding film 106 located directly on the carrier C1. In some embodiments, the carrier C1 is a semiconductor wafer, a silicon carrier or a glass carrier. Then, the first wafer 100 is thinned down from the backside until the ends of the first metallization structures 104 are exposed. In some embodiments, the thickness of the thinned first wafer 100 is about 20-30 microns.

Later, in FIG. 2C, the second wafer 200 is flipped (turned upside down) and placed on the thinned first wafer 100 with the bonding film 206 located directly on the thinned first wafer 100. During the placement of the second wafer 200, the second metallization structures 204 are substantially vertically aligned with the corresponding first metallization structures 104 respectively. In some embodiments, the first metallization structures 104 are considered as the first tier (Tier 1, T1) TSVs and the second metallization structures 204 are considered as the second tier (Tier 2, T2) TSVs, and the T2 TSVs are stacked and aligned with the T1 TSVs. In some embodiments, as the critical dimension of the second metallization structure is different from that of the first metallization structure, alignment tolerance becomes larger and reliable bonding is achieved. In certain embodiments, as shown in FIG. 2C, the critical dimension S2 of the second metallization structure 204 is larger than the critical dimension S1 of the first metallization structure 104.

Then, in some embodiments, as shown in FIG. 2C, a bonding process is performed to bond the first and second metallization structures 104, 204 to each other so as to bond the first and second wafers. In some embodiments, the bonding process is a hybrid bonding process. In one embodiments, during the application of hybrid bonding technology, a low temperature heating process at a temperature of about 100° C. to about 200° C. is performed to heat and bond the dielectric bonding film 206 to the semiconductor substrate 102 and a high temperature heating process is performed at a temperature of about 200° C. to about 300° C. to heat the metallization structures 104, 204 such that the conductive metallization structures 104, 204 are bonded and the dielectric bonding film 206 is cured and adhered to the semiconductor substrate 102. In some embodiments, the second wafer 200 is hybrid bonded to the thinned first wafer 100 through hybrid bonding. That is, as shown in the partially enlarged view at the right part of FIG. 2C, the bonding film 206 of the second wafer 200 is bonded to the semiconductor substrate 102 (such as silicon) of the thinned first wafer 100, and the second metallization structures 204 are bonded with the first metallization structures 104, thus achieving a hybrid bonding interface HB (represented by the dotted line in FIG. 2C). In one embodiment, in addition to the metal-to metal bonding interfaces established by the first and second metallization structures 104, 204, the hybrid bonding interface HB includes dielectric material to semiconductor material bonding interfaces established by the semiconductor substrate 102 and the dielectric bonding film 206. In some embodiments, the bonded first and second metallization structures 104, 204 are further electrically connected with interconnect structures 103 and metallic contact pad(s) 101 formed in the first die(s) of the first wafer 100. In addition, as shown in the partially enlarged view at the right part of FIG. 2C, the semiconductor devices 1050 in the device layer 105 are electrically connected with the first metallization structures 104 through the interconnect structures 103 in the first wafer 100. Then, in some embodiments, the second wafer 200 is also thinned down from the backside until the ends of the second metallization structures 204 are exposed. In some embodiments, the thickness of the thinned second wafer 200 is about 30-40 microns. In some embodiments, the thinning down process of the first or second wafer may include a polishing process, an etching process or a combination thereof. In some embodiments, the second wafer 200 may function as an interposer or a structural support. In other embodiments, the second wafer 200 includes semiconductor devices (not shown), which may be electrically connected with the second metallization structure 204 and further electrically connected with the semiconductor devices in the first wafer 100.

In embodiments, the first or second wafer or both wafers are provided with metallization structures having a higher aspect ratio (i.e. small critical dimension along with a longer length), less areas are occupied by the metallization structures and more active area are offered. After the first and second wafers are bonded together, the total thickness of the stacked first and second wafers is increased for better structural robustness. Also, due to the high aspect ratios of the first and second metallization structures, the first and second metallization structures do not occupy too much active areas, and the layout design for the semiconductor device(s) is flexible.

Figure 2D:
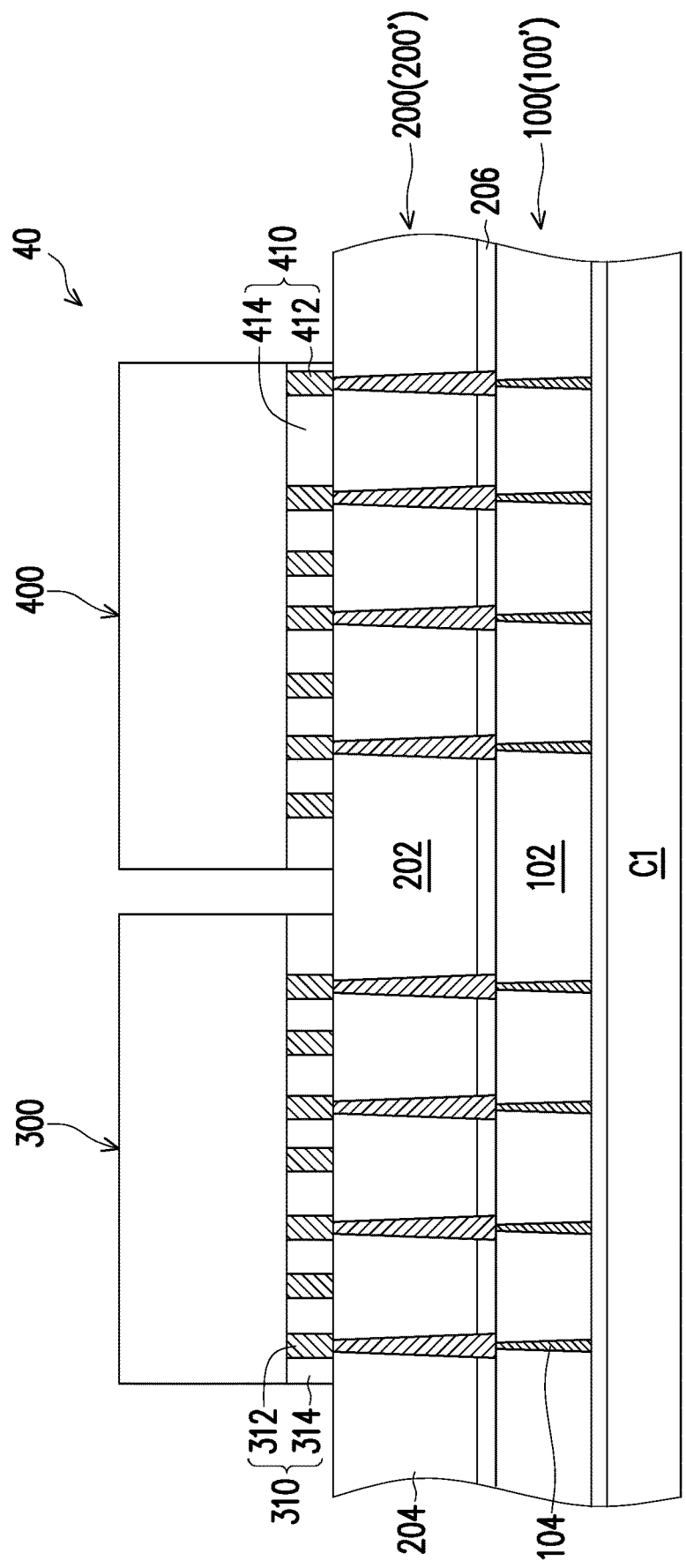

In FIG. 2D, a third die 300 and a fourth die 400 are provided and disposed side-by side on the backside of the second wafer 200. In some embodiments, the third die 300 and the fourth die 400 are provided with hybrid bonding structures 310, 410. In some embodiments, a bonding process is performed to bond the third die 300 and the fourth die 400 with the second wafer 200. In some embodiments, the bonding process is a hybrid bonding process including performing a thermal process at a temperature ranging from 100° C. to 400° C. under a pressure of about 100~1000 mtorr. As shown in FIG. 2D, the hybrid bonding structure 310 includes conductive features 312 embedded in a dielectric material 314 formed on the active surface of the third die 300. In some embodiments, the hybrid bonding structure 410 includes conductive features 412 embedded in a dielectric material 414 formed on the active surface of the fourth die 400. In some embodiments, the front side of the third die 300 is hybrid-bonded to the backside of the second wafer 200 through the hybrid bonding structure 310. That is, the conductive features 312 are bonded with the second metallization structures 204, while the dielectric material 314 is bonded with the semiconductor material (such as silicon) of the substrate 202 of the second wafer 200. In some embodiments, the front side of the fourth die 400 is hybrid-bonded to the backside of the second wafer 200 through the hybrid bonding structure 410. That is, the conductive features 412 are bonded with the second metallization structures 204, while the dielectric material 414 is bonded with the semiconductor material (such as silicon) of the substrate 202 of the second wafer 200. In these embodiments, the metallization structure of the first and second dies or the through-substrate vias (TSVs) of the first and second dies may be considered as parts of hybrid bonding structures for establishing shorter and direct electrical paths. Also, the hybrid bonding structures of the third or fourth die described in the above embodiments are compatible with the TSVs.

Optionally, in some embodiments, the third die 300 or the fourth die 400 may be thinned down from the backside to a desirable thickness. In some embodiments, the thinning down process of the third die 300 or the fourth die 400 may include a polishing process, an etching process or a combination thereof.

Referring to FIG. 2D, one third die 300 and one fourth die 400 are provided over the second wafer 200. It is understood that the number of the third or fourth die may be one, two or more than two, but the disclosure is not limited thereto. In some embodiments, the third die 300 and the fourth die 400 have different functions. In some embodiments, the third die 300 and the fourth die 400 have the same function. In some embodiments, the third die 300 or the fourth die 400 includes a memory chip such as a high bandwidth memory chip, a dynamic random access memory (DRAM) chip or a static random access memory (SRAM) chip. In some alternative embodiments, the third die 300 or the fourth die 400 includes an application-specific integrated circuit (ASIC) chip, an analog chip, a sensor chip, a wireless application chip such as a Bluetooth chip and a radio frequency chip or a voltage regulator chip. In one embodiment, the third die 300 includes a memory chip, and the fourth die 400 includes an ASIC chip. Although not expressly shown in FIG. 2D, some of the conductive features of the third die or the fourth die are electrically interconnected to one another and some of the conductive features are electrically connected with the underlying semiconductor devices in the third die or fourth die. The third die 300 and the fourth die 400 are electrically connected with the second die(s) 200' and/or the first die(s) 100'.

In exemplary embodiments, the conductive features 312, 412 are made of conductive materials, such as copper (Cu), copper alloys, aluminum (Al), aluminum alloys, nickel (Ni), solder materials or combinations thereof. In some embodiments, a material of the dielectric material 314, 414 includes silicon oxide, silicon nitride, or silicon oxynitride (SiON).

Figure 2E:
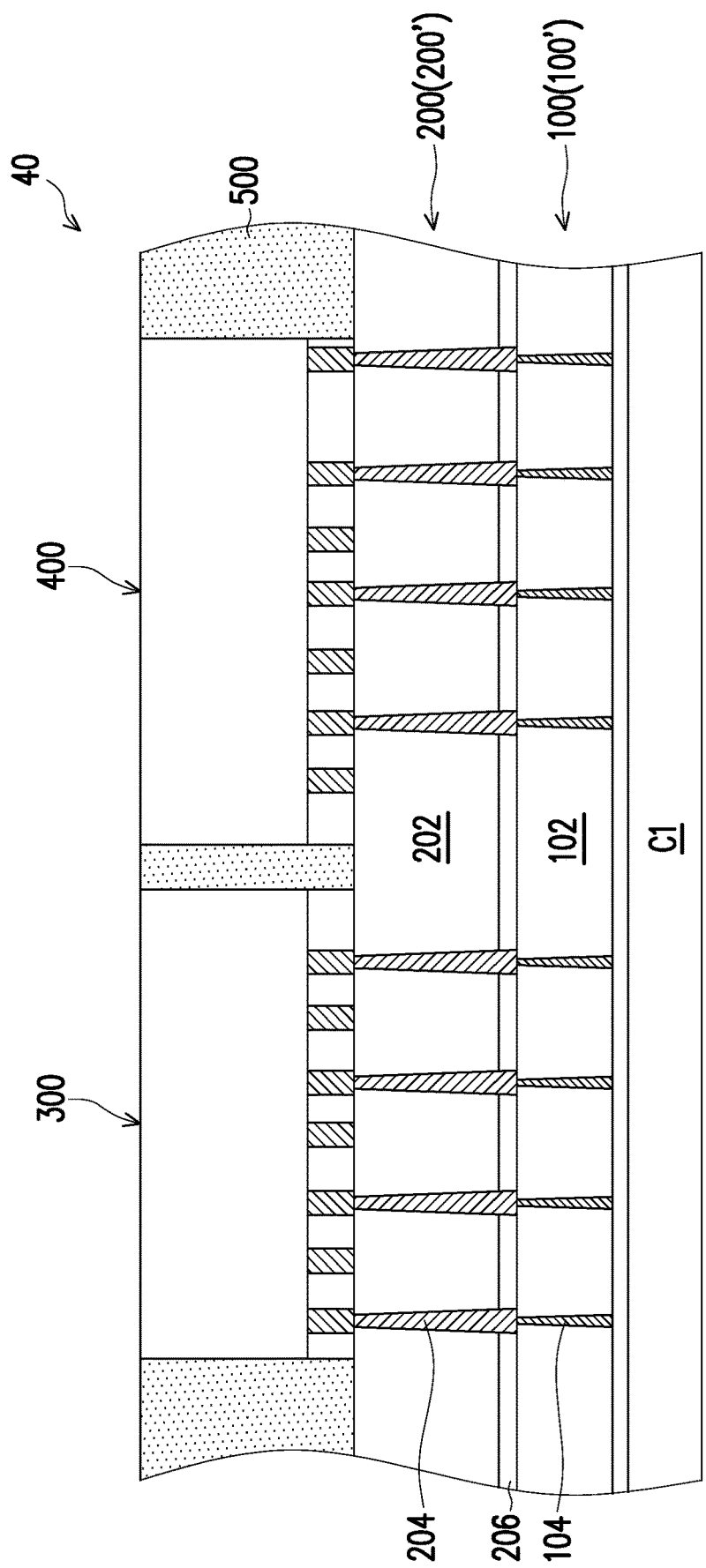

In some embodiments, in FIG. 2E, an encapsulant 500 is formed over the stacked structure 40 of the first wafer 100, the second wafer 200, the third die 300 and the fourth die 400 and at least laterally covers the third die 300 and the fourth die 400 mounted on the second wafer 200. The encapsulant 500 covers the backside of the second wafer 200, fills the gaps between the third die 300 and the fourth die 400 and wraps around the sidewalls of the third die 300 and the fourth die 400. In some embodiments, the encapsulant 500 is formed by a molding process such as overmolding and then polished or planarized to expose the backsides of the third die 300 and the fourth die 400. In some embodiments, the material of the encapsulant 500 includes epoxy resins, phenolic resins or silicon-containing resins.

Figure 2F:
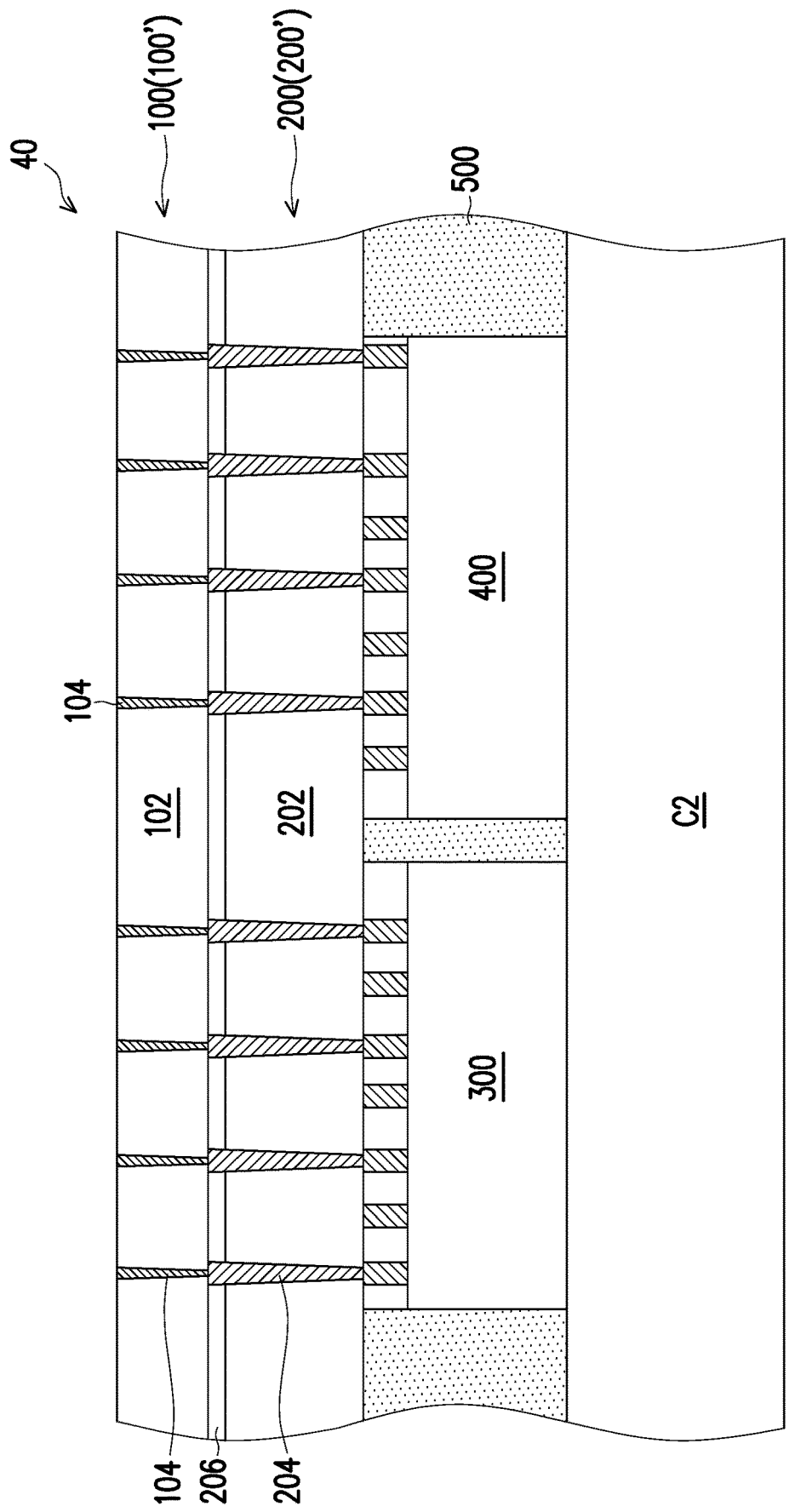

In FIG. 2F, the stack structure 40 is flipped and transferred to another carrier C2. In some embodiments, the carrier C1 includes a silicon carrier and the carrier C1 is removed by performing a grinding process and/or a polishing process (such as a chemical mechanical polishing process) and the bonding film 106 may be removed along with the carrier C1. After the carrier C1 and the bonding film 106 are removed, the first metallization structures 104 are exposed. In certain embodiments, the carrier C2 is a glass carrier.

Figure 2G:
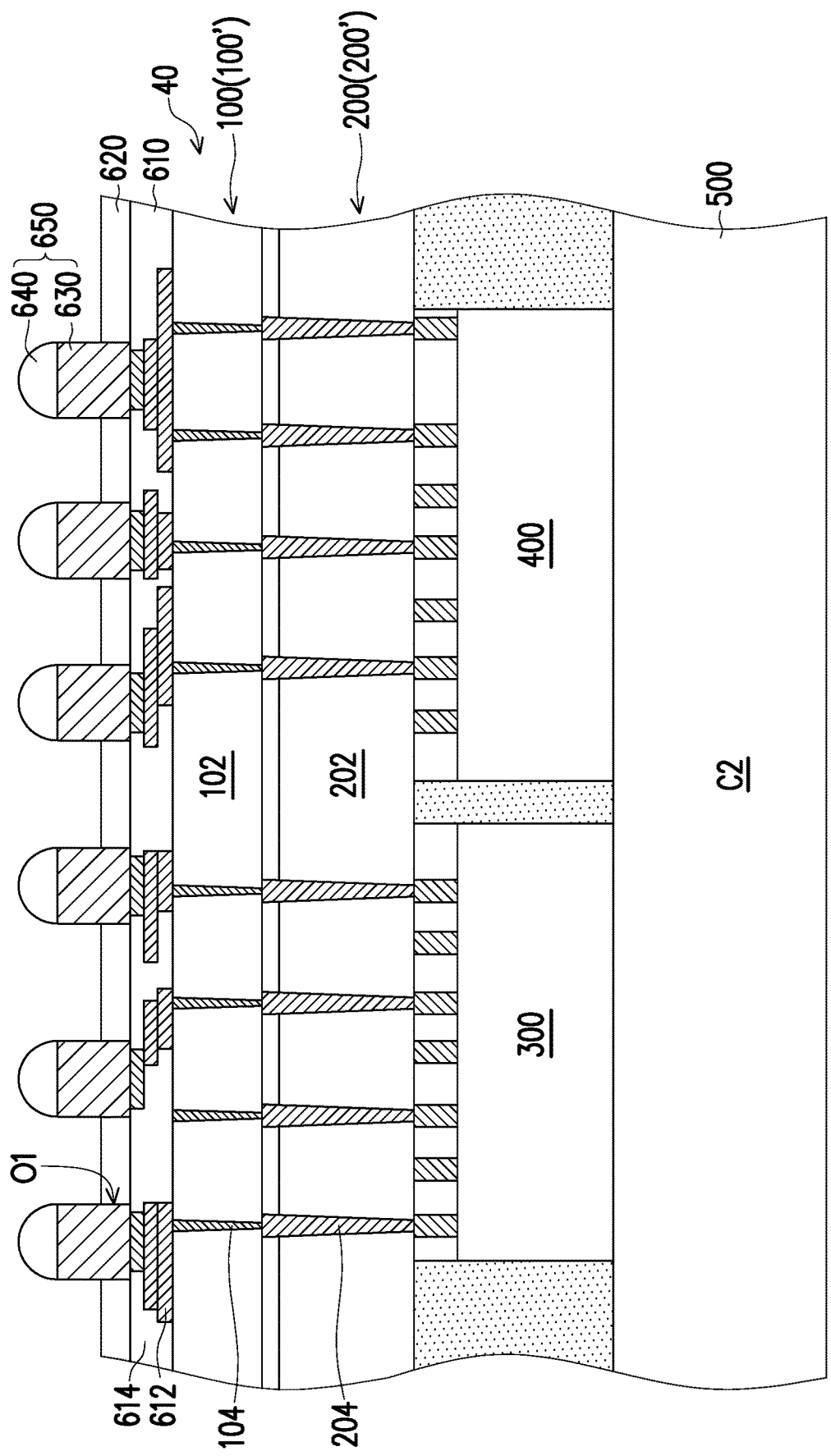

In FIG. 2G, in some embodiments, a redistribution layer (RDL) 610 is formed over the first wafer 100 covering the first metallization structure 104. The redistribution layer (RDL) 610 is formed over the stack structure 40 and is electrically connected to the die stack structure 40. In some embodiments, the RDL 610 includes redistribution patterns 612 embedded in at least one dielectric material layer 614. The number of the redistribution patterns or the dielectric material layer is not limited by the disclosure. The redistribution patterns 612 includes routing patterns and bump pads, for example. In certain embodiments, an insulating layer 620 is formed on the RDL 610. For example, the insulating layer 620 is formed with openings O1 exposing some of the underlying redistribution patterns 612. Then, metal posts 630 and glops 640 are formed in the openings O1. In some embodiments, the material of the dielectric material layer 614 or the insulating layer 620 includes silicon oxide, silicon nitride, benzocyclobutene (BCB), epoxy, polyimide (PI), or polybenzoxazole (PBO). In some embodiments, a material of the metal posts includes copper or cooper alloys, and a material of the glops 640 includes solder. Herein, the metal posts 630 and glops 640 located on the metal posts 630 constitute micro bump structures 650. In alternative embodiments, only the metal posts 630 are formed in the openings O1 and connected to the bump pads in the underlying redistribution patterns 612.

Figure 2H:
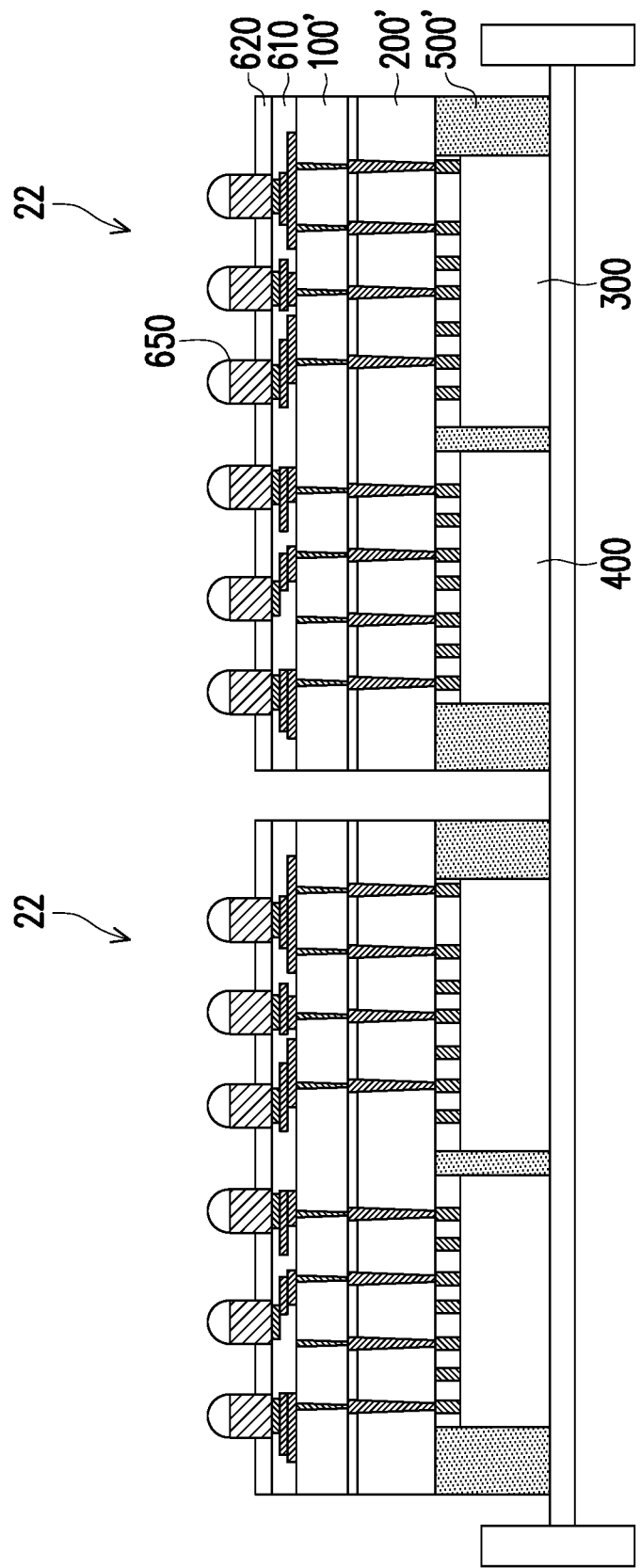

Later, in some embodiments, after separating the stack structure 40 from the carrier C2, in FIG. 2H, a singulation process is performed to cut the stack structure 40 into individual 3D stacking structures 22. In some embodiments, the singulation process includes a wafer dicing process or a sawing process. Each of the stacking structures 22 includes at least the first die 100', the second die 200', the third die 300, the fourth die 400 and the encapsulant 500' wrapping around the third and fourth dies. In some embodiments, through the direct bonded metallization structures and hybrid bonding structures, shorter connection path(s) is established and the reliability of the 3D stacking structures 22 is improved.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

As the 3D stacking structure 20 or 22 includes multiple dies stacked on one another and connected with one another through hybrid bonding, the stacked dies are integrated in a compact form through direct bonding as well as hybrid bonding. In some embodiments, the 3D stacking structure 20, 22 may be considered as an integrated circuit (IC) die or a system-on-integrated-chip (SoIC) die.

Figure 3:
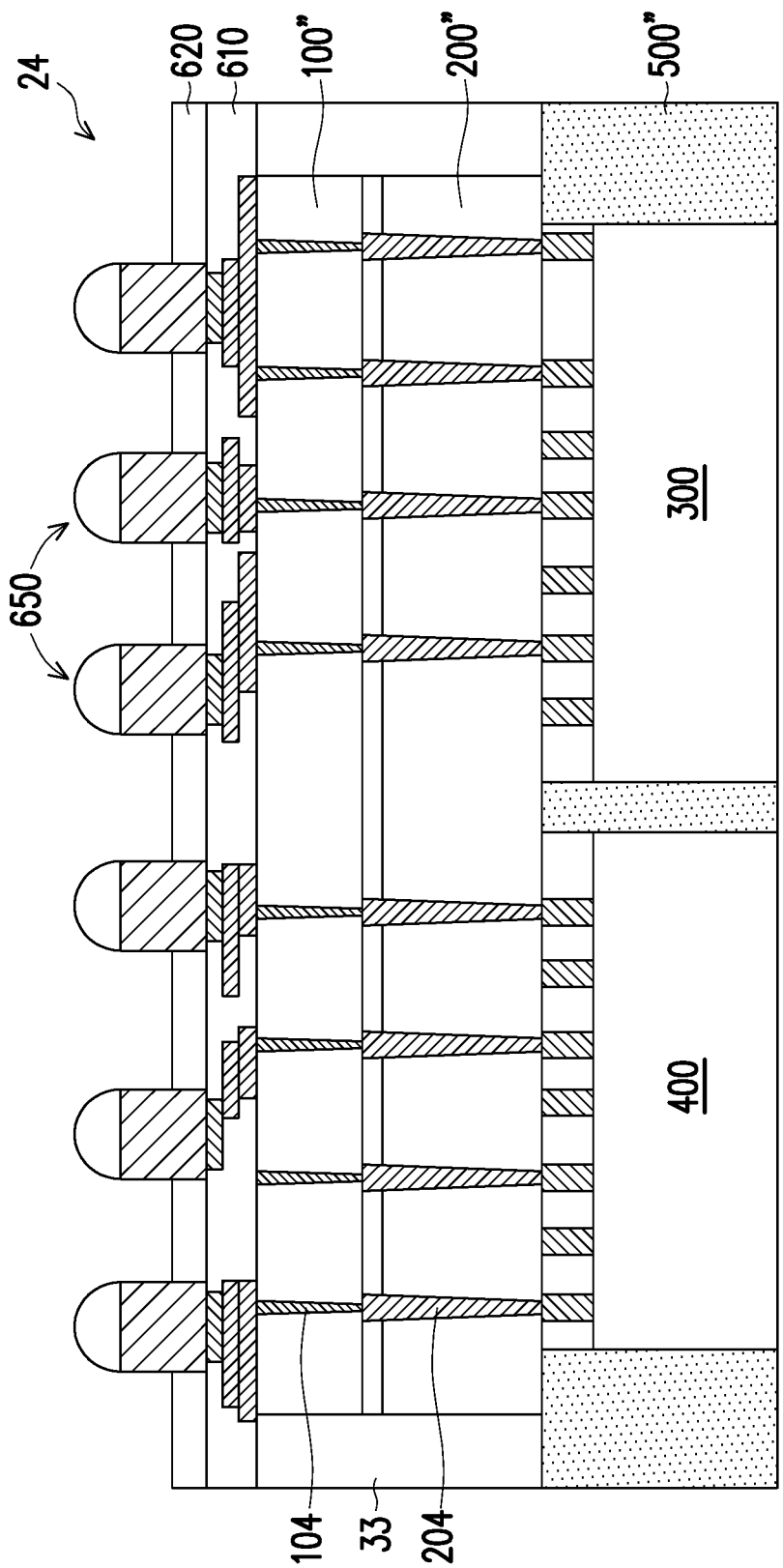
FIG. 3 illustrates a cross-sectional view of a portion of an exemplary 3D stacking structure in accordance with some embodiments of the present disclosure.

FIG. 3 illustrates a cross-sectional view of a portion of an exemplary 3D stacking structure in accordance with some embodiments of the present disclosure. In FIG. 3, the 3D stacking structure 24 includes at least the first die 100", the second die 200", the third die 300, the fourth die 400 and the encapsulant 500" wrapping around the third and fourth dies 300, 400. In addition, the structure 24 includes a redistribution layer 610, an insulating layer 620 and micro bump structures 650 on the stacked structure of the first die 100" and the second die 200". Compared with the 3D stacking structure 22, the main structural difference of the 3D stacking structure 24 lies in that a filling material 33 laterally wraps around the stacked structure of the first die 100" and the second die 200". In some embodiments, the material of the filling material 33 includes silicon oxide, and the material of the filling material 33 is different from that material of the encapsulant 500". Except for the similar manufacturing processes as described above, the first die 100" and the second die 200" are provided in the singulated form as individual dies, rather than being provided in the wafer form. In some embodiments, after the first die 100" and the second die 200" are stacked and hybrid-bonded through the first and second metallization structures 104, 204 and bonding film 206, a filling material 33 is supplied to cover first die(s) 100" and the second die(s) 200" and a planarization process may be performed to form a reconstructed wafer or panel. The other following manufacturing processes are similar or the same as those described in the previous embodiments, and details are skipped herein.

In exemplary embodiments, the 3D stacking structures 20, 22, 24 as described above may be additional processed in the subsequent processes to be connected with further connection structures before dicing, and these subsequent processes may be modified based on the product design and will not be described in details herein.

FIGS. 4A-4F illustrate enlarged cross-sectional views of hybrid bonding portions of an exemplary 3D stacking structure in accordance with various embodiments of the present disclosure.

Figure 4A:
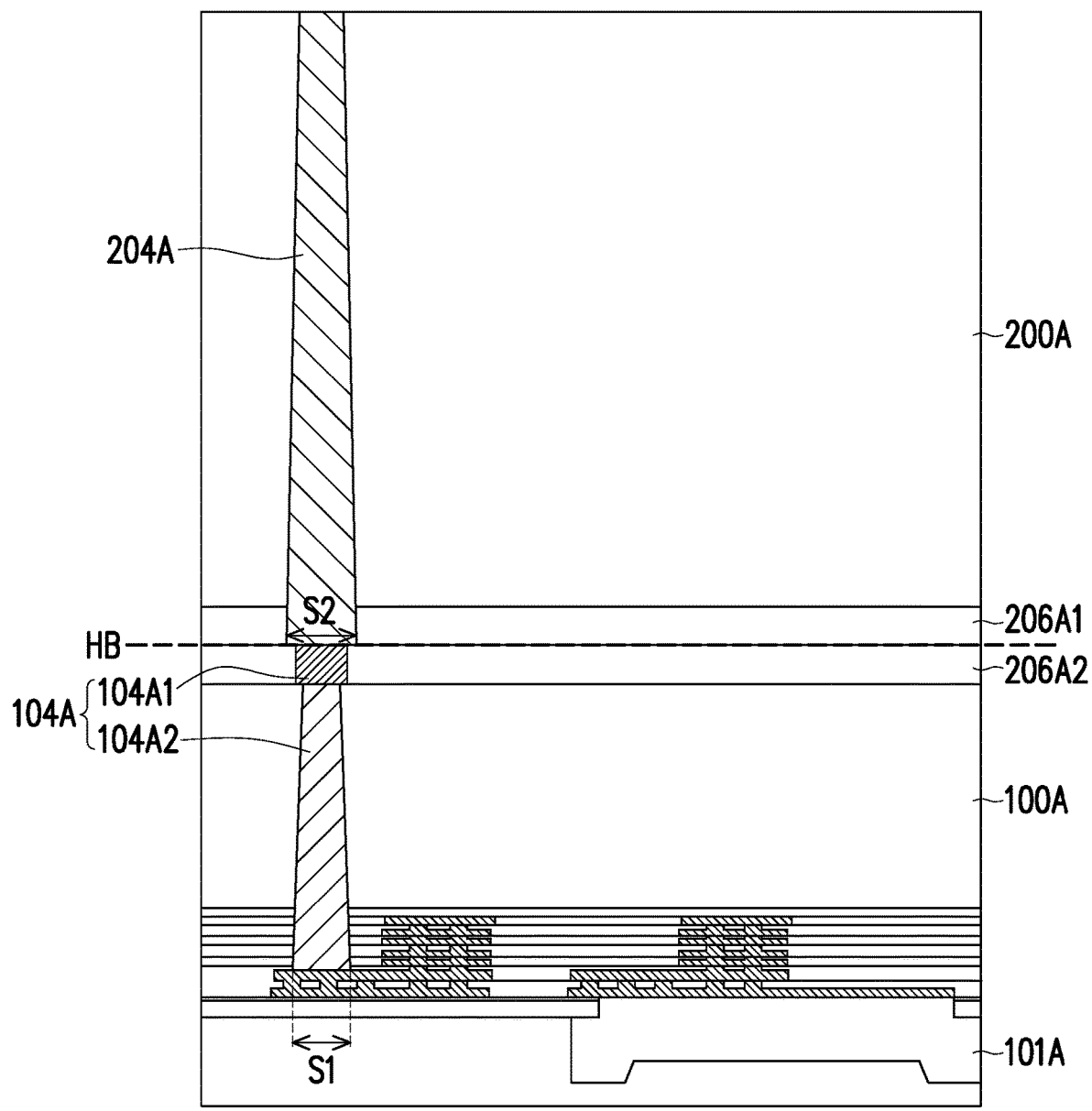
FIGS. 4A-4G illustrate enlarged cross-sectional views of portions of an exemplary 3D stacking structure in accordance with various embodiments of the present disclosure.
Figure 4B:
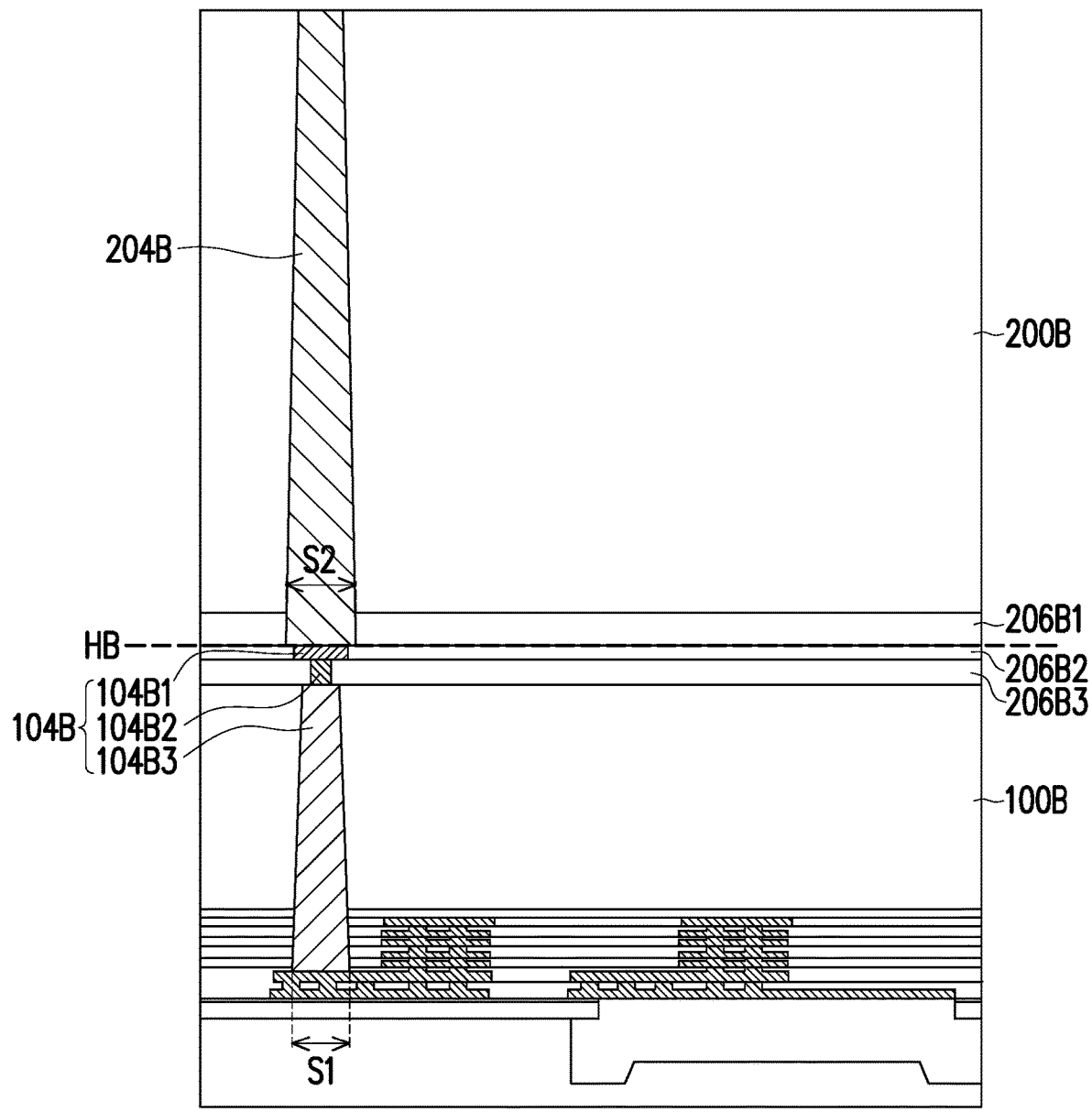

In FIGS. 4A & 4B, in some embodiments, the second metallization structure 204A, 204B of the second die 200A, 200B has a critical dimension S2 larger than a critical dimension S1 of the first metallization 104A, 104B of the first die 100A, 100B. In FIG. 4A, the second metallization structure 204A penetrates through the bonding film 206A1. The first metallization structure 104A includes a metal bonding pad 104A1 embedded in the bonding film 206A2 and a metal via 104A2 connected with the metal bonding pad 104A1. In FIG. 4A, a hybrid bonding interface HB (represented by the dotted line) is formed between the bonding films 206A1, 206A2 and between the first and second metallization structures 204A, 104A. In one embodiment, in addition to the metal-to metal bonding interfaces established by the first and second metallization structures 104A, 204A, the hybrid bonding interface HB includes dielectric material to dielectric material bonding interfaces established by the dielectric bonding films 206A1, 206A2. The materials of the bonding films 206A1, 206A2 may be similar to the materials of the bonding film 206 described in the previous embodiments. In one embodiment, the material of the bonding film 206A1 is the same as the material of the bonding film 206A2. In one embodiment, the material of the bonding film 206A1 is different from the material of the bonding film 206A2.

In FIG. 4B, the second metallization structure 204B penetrates through the bonding film 206B1. The first metallization structure 104B includes a metal bonding pad 104B1 embedded in the bonding film 206B2, a metal neck portion 104B2 embedded in the bonding film 206B3 and a metal via 104B3. The metal neck portion 104B2 connects the metal bonding pad 104B1 and the metal via 104B3. In FIG. 4B, a hybrid bonding interface HB (represented by the dotted line) is formed between the dielectric bonding film 206B1 and dielectric bonding film 206A2 and between the first and second metallization structures 204B, 104B. In one embodiment, the material of the bonding film 206B1 is the same as the material of the bonding films 206B2, 206B3. In one embodiment, the material of the bonding film 206B1 is different from the material of the bonding films 206B2, 206B3. In one embodiment, the material of the bonding film 206B1 is the same as the material of the bonding film 206B3 and is different from the material of the bonding film 206B2.

Figure 4C:
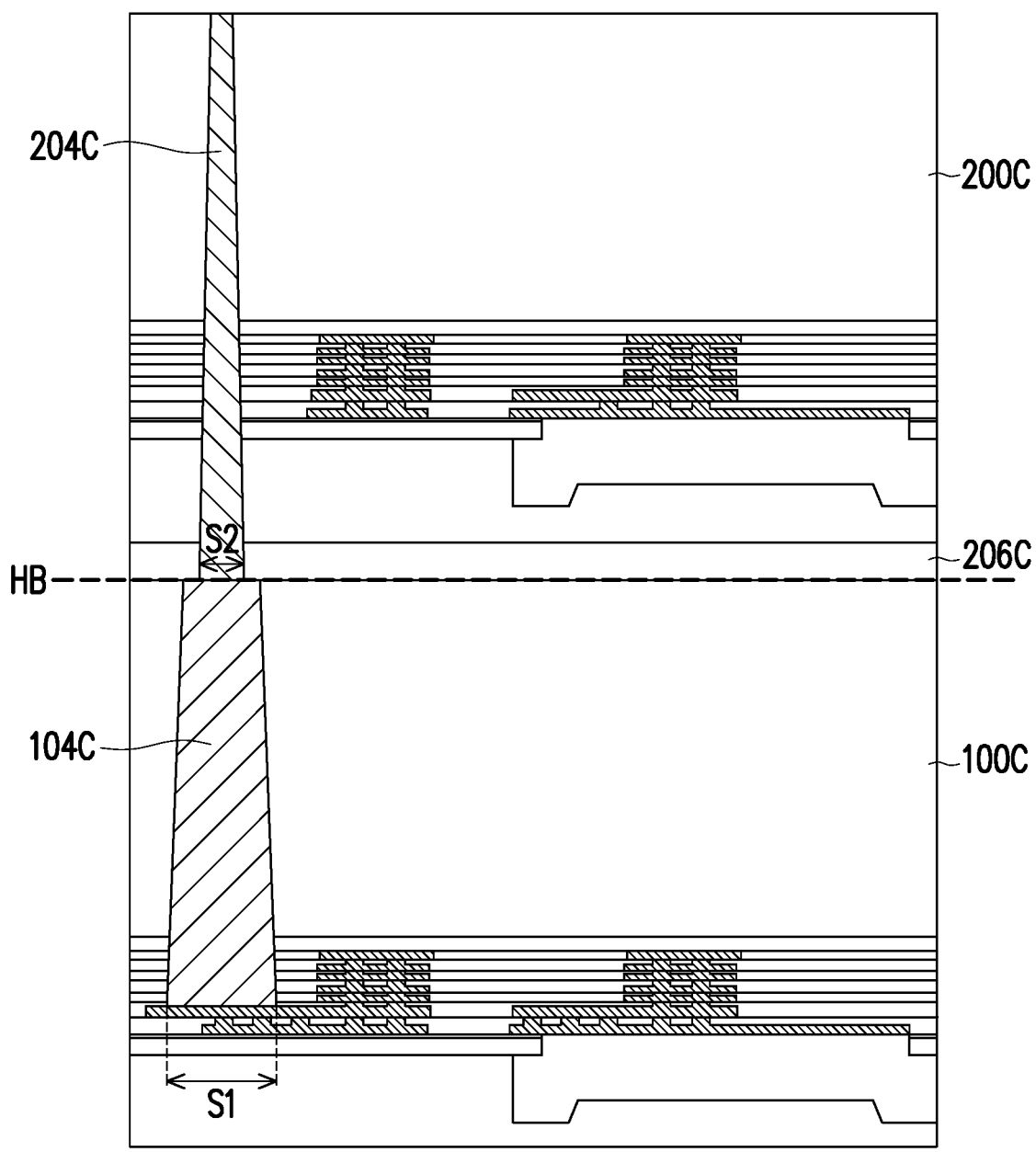
Figure 4D:
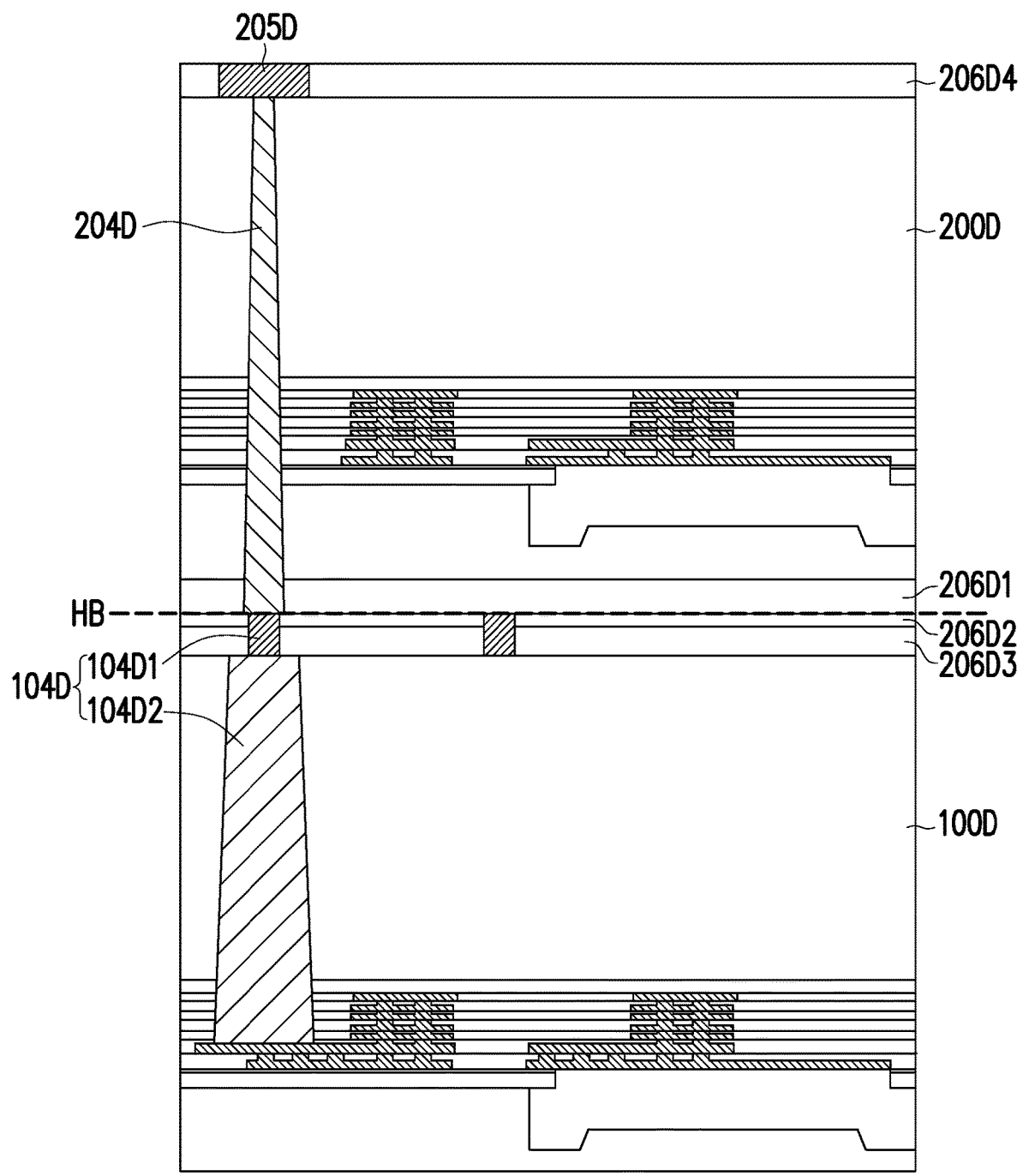

In FIGS. 4C & 4D, in some embodiments, the second metallization structure 204C, 204D of the second die 200C, 200D has a critical dimension S2 smaller than a critical dimension S1 of the first metallization 104C, 104D of the first die 100C, 100D. In FIG. 4C, the second metallization structure 204C penetrates through the bonding film 206C. The first metallization structure 104C directly connects with the second metallization structure 204C. In FIG. 4C, a hybrid bonding interface HB (represented by the dotted line) is formed between the bonding films 206C and the semiconductor substrate (such as silicon) of the first die 100C and between the first and second metallization structures 204C, 104C.

In FIG. 4D, the second metallization structure 204D penetrates through the bonding film 206D1. The first metallization structure 104D includes a metal bonding pad 104D1 embedded in the composite bonding films 206D2, 206D3 and a metal via 104D2 connected to the metal bonding pad 104D1. In FIG. 4D, a hybrid bonding interface HB (represented by the dotted line) is formed between the film 206D1 and film 206D2 and between the first and second metallization structures 204D, 104D. In FIG. 4D, another bonding film 206D4 is further included on the backside of the second die 200D and another metal bonding pad 205D is embedded in the bonding film 206D4 for subsequent bonding or connection.

Figure 4E:
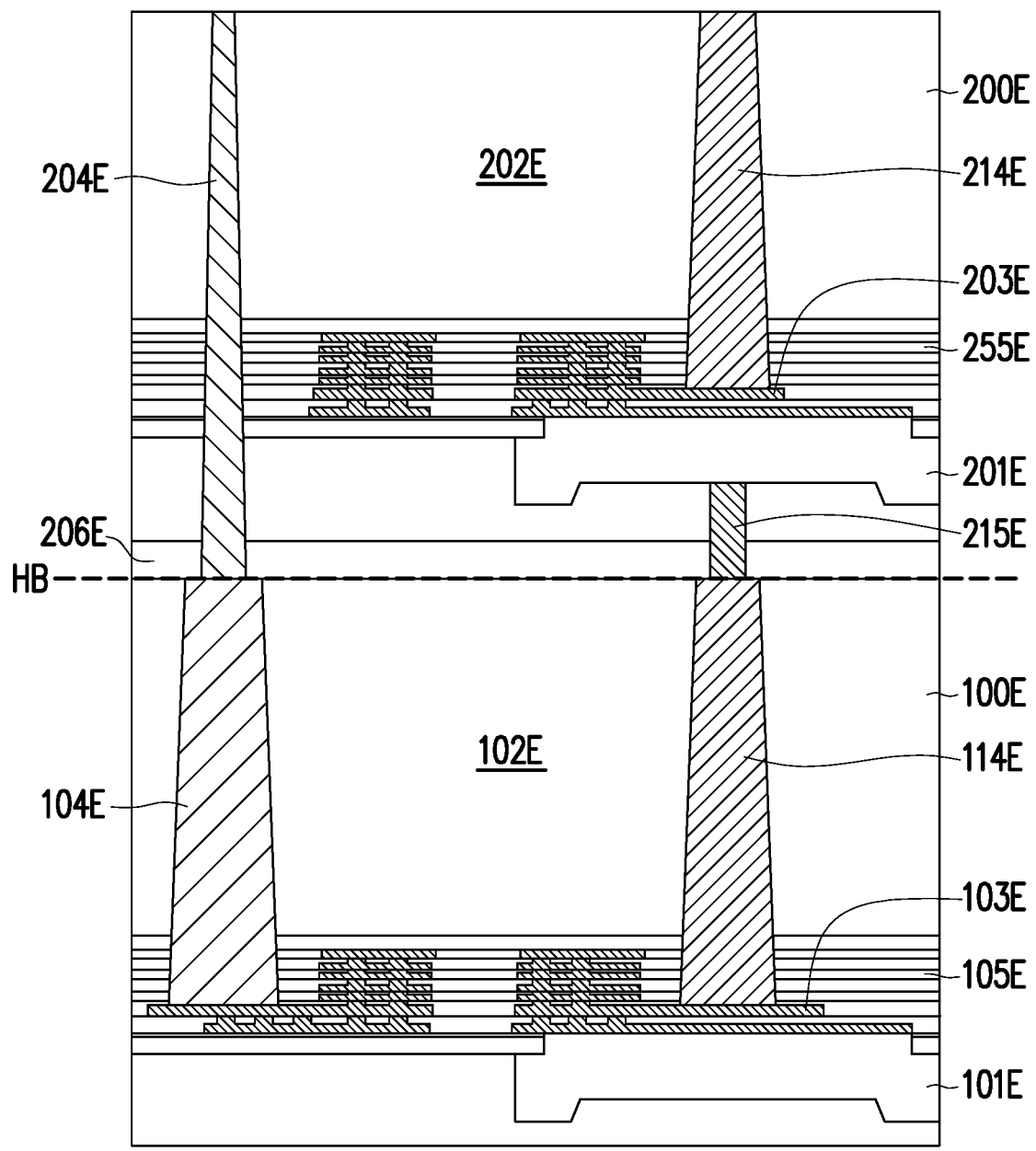
Figure 4F:
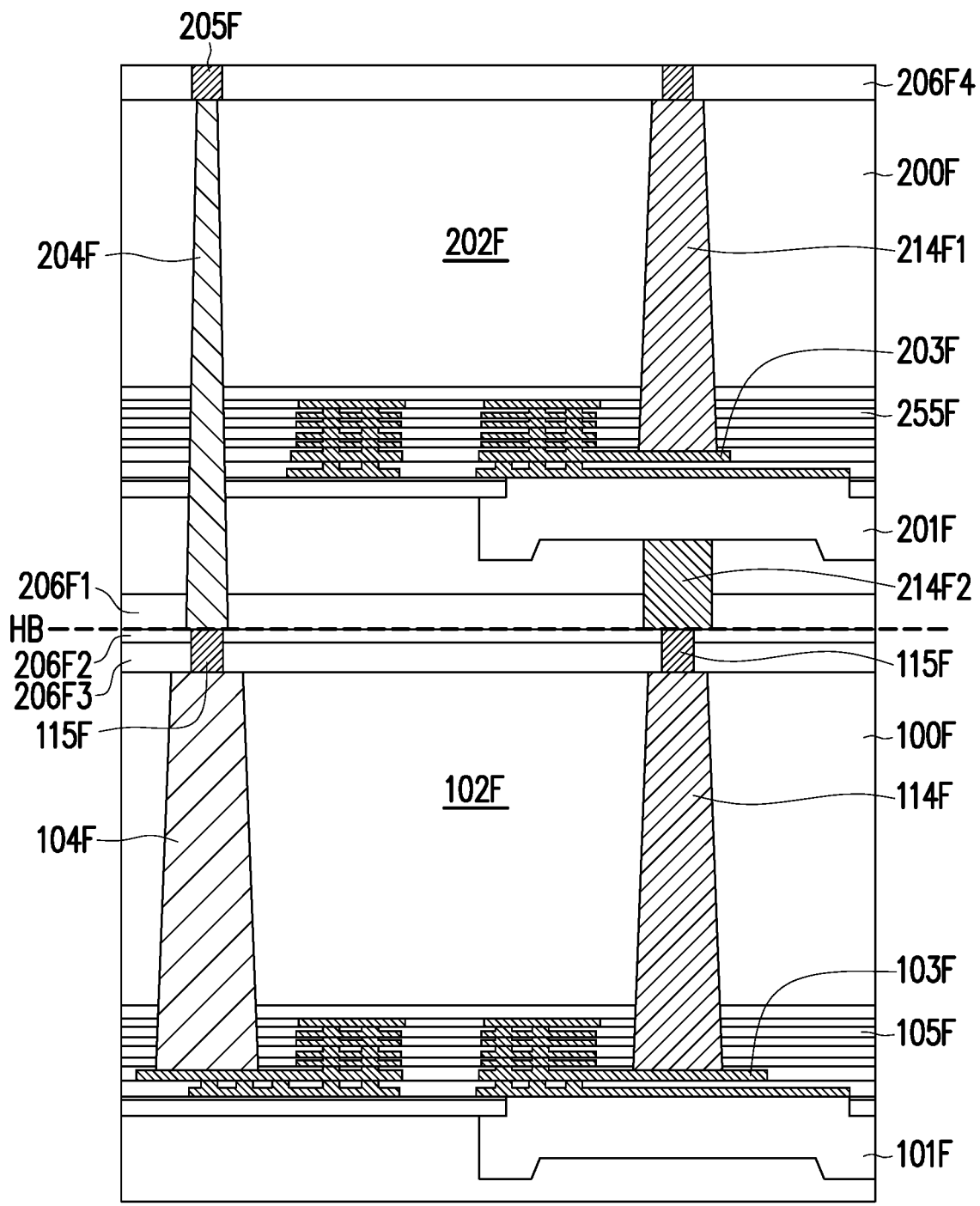

In FIG. 4E & FIG. 4F, similar to FIG. 4C & FIG. 4D, the second metallization structure 204E, 204F has a critical dimension S2 smaller than a critical dimension S1 of the first metallization 104E, 104F, but the structures shown in FIG. 4E and FIG. 4F further includes signal through vias. In FIG. 4E, in some embodiments, the first die 100E includes first signal through vias 114E penetrating through the semiconductor substrate 102E and directly connected with the interconnect structures 103E in the device layer 105E. The first signal through via 114E is electrically connected with the metallic contact pad 101E through the interconnect structures 103E. In some embodiments, the second die 200E includes second signal through vias 214E penetrating through the semiconductor substrate 202E and directly connected with the interconnect structures 203E in the device layer 255E. The second signal through via 214E is electrically connected with the metallic contact pad 201E through the interconnect structures 203E. The second die 200E also includes a third signal through via 215E extending between the metallic contact pad 201E and the first signal through via 114E and penetrating through the bonding film 206E. In some embodiments, the device layer includes semiconductor devices, and the semiconductor devices may include active devices, passive devices or the combinations thereof.

In FIG. 4E, the first and second signal through vias 114E, 214E are electrically connected through the interconnect structure 203E, the metallic contact pad 201E and the signal through via 215E. In some embodiments, the size (or critical dimension) of the first signal through via 114E is different from that of the second signal through via 214E. In some embodiments, the size (or critical dimension) of the first signal through via 114E is substantially equivalent to that of the second signal through via 214E. In some embodiments, the critical dimension of the signal through via is smaller than S1 but larger than S2. In certain embodiments, the materials of the signal through via are similar to those of the metallization structures as describe above. In FIG. 4E, the semiconductor devices (not shown) in the second die 200E may be electrically connected with the semiconductor devices (not shown) in the first die 100E through the electrical connection between the first and second signal through vias 114E, 214E and the third signal through via(s) 215E.

In some embodiments, in FIG. 4F, the first die 100F includes first signal through vias 114F penetrating through the semiconductor substrate 102F and connected with the interconnect structures 103F in the device layer 105F. The first signal through via 114F is electrically connected with the metallic contact pad 101F through the interconnect structures 103F. In some embodiments, the second die 200F includes second signal through vias 214F1 penetrating through the semiconductor substrate 202F and directly connected with the interconnect structures 203F in the device layer 255F, and third signal through via 214F2 connected with the metallic contact pad 201F and penetrating through the bonding film 206F1. In FIG. 4F, metal bonding pads 115F that respectively penetrate through the bonding films 206F2, 206F3 connect the third signal through via 214F2 and the first signal through via 114F as well as the first and second metallization structures 104F, 204F.

In some embodiments, in FIG. 4F, the first, second and third signal through vias 114F, 214F1, 214F2 are electrically connected through the interconnect structure 203F, the metallic contact pad 201F and the metal bonding pad 115F. The second die 200F also includes metal bonding pads 205F embedded in the bonding film 206F4 on the backside of the second die 200F.

Figure 4G:
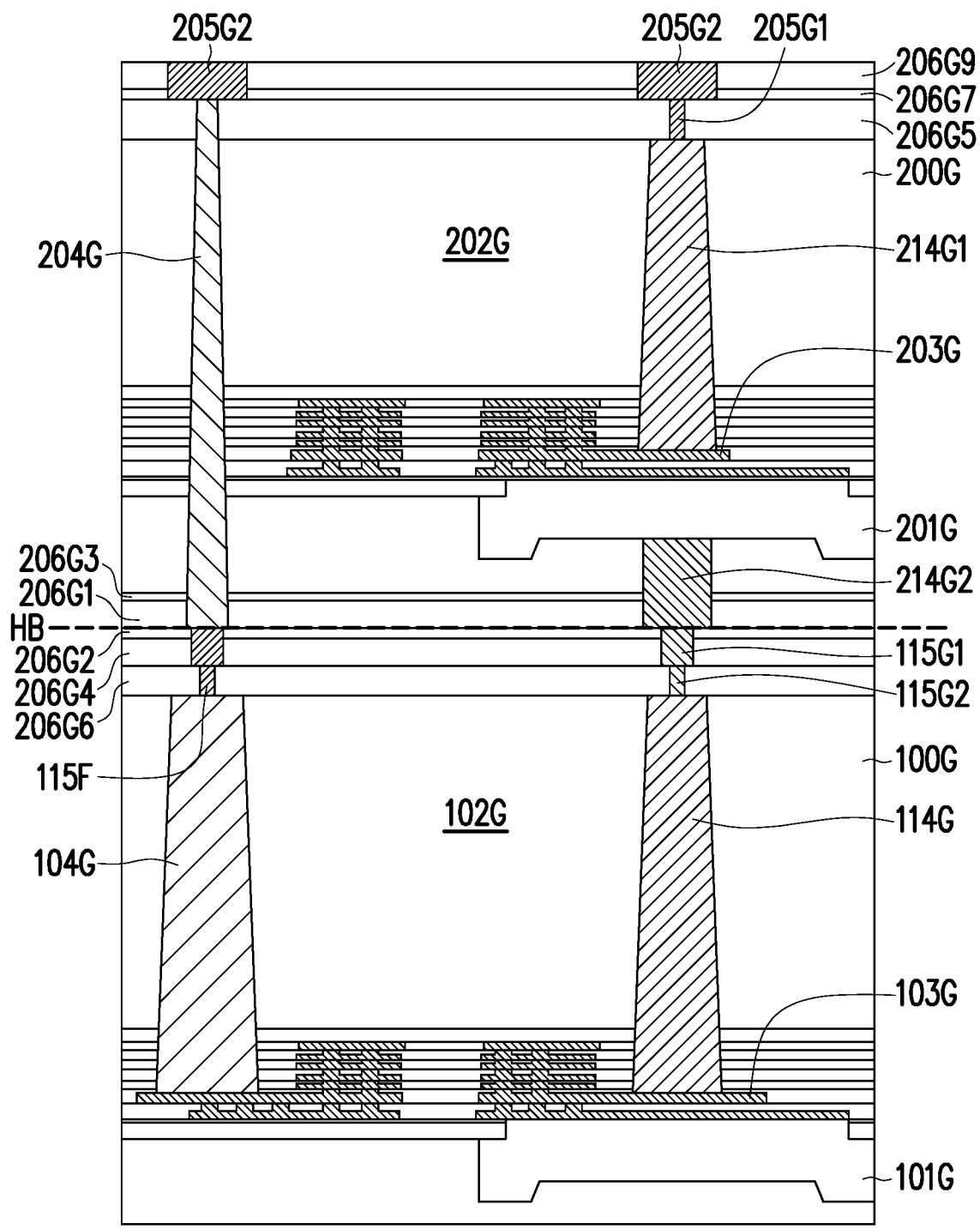

In FIG. 4G, similar to FIG. 4D and FIG. 4F, the second metallization structure 204G has a critical dimension S2 smaller than a critical dimension S1 of the first metallization 104G. In FIG. 4G, in some embodiments, the first die 100G includes first signal through vias 114G penetrating through the semiconductor substrate 102G and directly connected with the interconnect structures 103G. The first signal through via 114G is electrically connected with the metallic contact pad 101G through the interconnect structures 103G. In some embodiments, the second die 200G includes second signal through vias 214G1 penetrating through the semiconductor substrate 202G and directly connected with the interconnect structures 203G, and third signal through via 214G2 connected with the metallic contact pad 201G and penetrating through the bonding films 206G1/206G3. The second signal through via 214G1 is electrically connected with the metallic contact pad 201G through the interconnect structures 203G. In FIG. 4G, metal bonding pads 115G1 and 115G2 that respectively penetrate through the bonding films 206G2/206G4 and 206G6 connect the third signal through via 214G2 and the first signal through via 114G as well as the first and second metallization structures 104G, 204G.

In FIG. 4G, in some embodiments, the size (or critical dimension) of the first signal through via 114G is different from that of the second signal through via 214G. In some embodiments, the size (or critical dimension) of the first signal through via 114G is substantially equivalent to that of the second signal through via 214G. In some embodiments, the critical dimension of the signal through via is smaller than S1 but larger than S2. In FIG. 4G, the semiconductor devices (not shown) in the second die 200G may be electrically connected with the semiconductor devices (not shown) in the first die 100G through the electrical connection between the first, second and third signal through vias 114G, 214G1 and 214G2.

In some embodiments, in FIG. 4G, the first, second and third signal through vias 114G, 214G1, 214G2 are electrically connected through the interconnect structure 203G, the metallic contact pad 201G and the metal bonding pads 115G1, 115G2. The second die 200G also includes a metal bonding pad 205G1 embedded in the bonding film 206G5 and metal bonding pads 205G2 embedded in the bonding films 206G7/206G9 on the backside of the second die 200G. In FIG. 4G, the second metallization structure 204G extends between the metal bonding pad 205G2 and the metal bonding pad 115G1.

In FIG. 4G, a hybrid bonding interface HB (represented by the dotted line) is formed between the film 206G1 and film 206G2, between the second metallization structure 204G and the metallic bonding pad 115G1 and between the third signal through via 214G2 and the metallic bonding pad 115G1.

Figure 5:
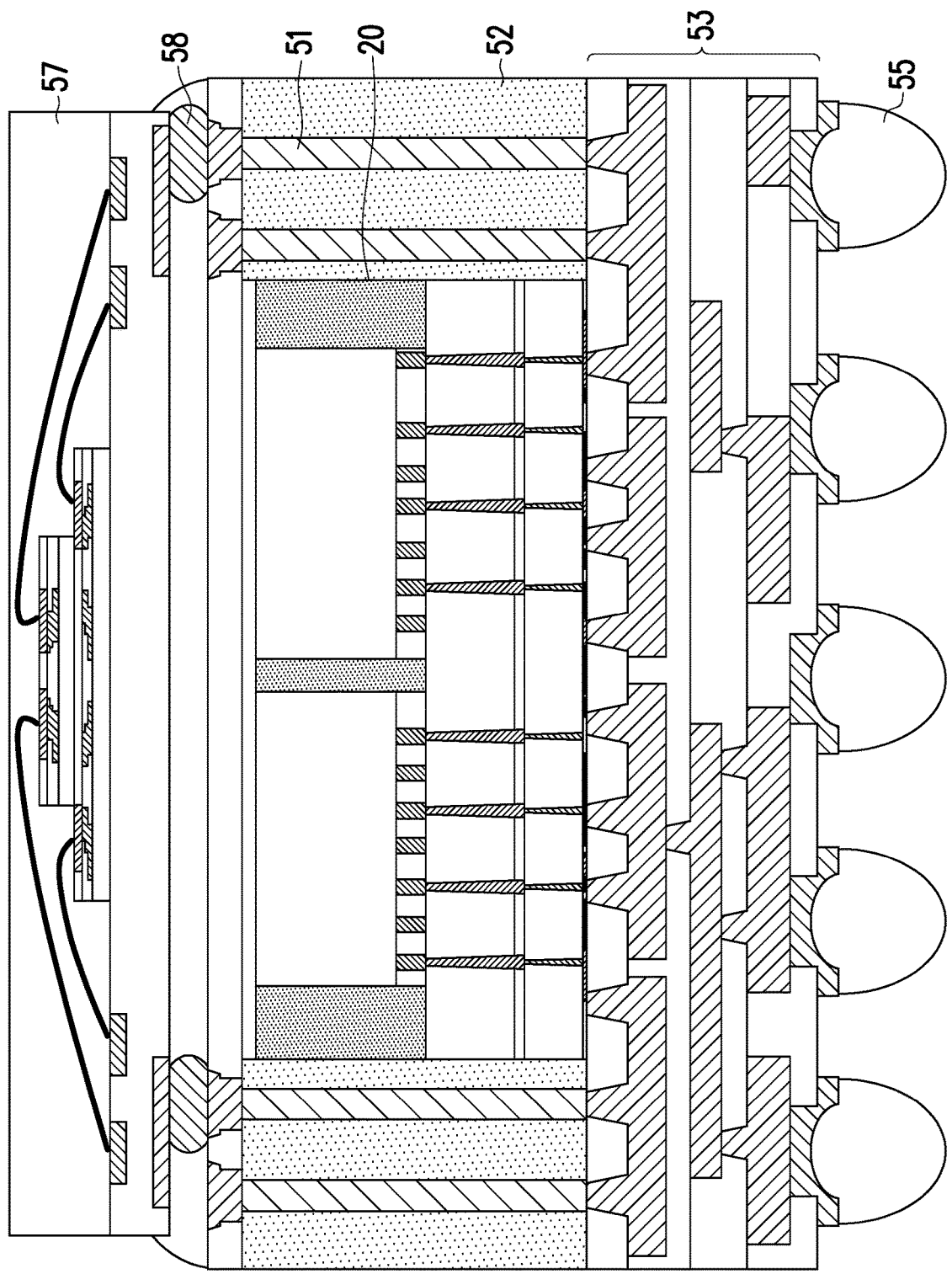
FIG. 5 illustrates a cross-sectional view of a semiconductor package in accordance with some embodiments of the present disclosure.

FIG. 5 illustrates a cross-sectional view of a semiconductor package in accordance with some embodiments of the present disclosure. In some embodiment, the semiconductor package 50 includes at least one 3D stacking structure 20 surrounding by through interlayer vias (TIVs) 51 and laterally encapsulated in a molding compound 52. A redistribution structure 53 is disposed on one side of the 3D stacking structure 20 and a plurality of conductive terminals 55 are connected to the redistribution structure 53. The semiconductor package 50 further includes another package unit 57 having more than one dies or chips connected with the TIVs 51 through the conductive bumps 58. In some embodiments, the semiconductor package 50 includes a package-on-package (POP) structure.

In exemplary embodiments, through the arrangement of at least two tiers of TSVs, there is no need to use very high aspect ratio TSVs and the production yield and reliability are significantly enhanced. Additionally, the design of two or more tier of TSVs leads to the formation of TSVs of smaller critical dimensions and provides more active areas for active devices.

In some embodiments of the present disclosure, a stacking structure is provided. The stacking structure includes a first die, a second die stacked on the first die, and a third die and a fourth die disposed on the second die. The first die has a first metallization structure, and the first metallization structure includes first through die vias. The second die has a second metallization structure, and the second metallization structure includes second through die vias. The first through die vias are bonded with the second through die vias, and critical dimensions of the first through die vias are different from critical dimensions of the second through die vias. The third and fourth dies are disposed side-by-side and are bonded with the second through die vias.

In some embodiments of the present disclosure, a stacking structure including a stack of a first die and a second die, third dies and an encapsulant is provided. The first die includes first through die vias. The second die stacked on the first die includes second through die vias. The first die is hybrid bonded with the second die through a bonding film located between the first and second dies and the first through die vias bonded with the second through die vias. Critical dimensions of the first through die vias are different from critical dimensions of the second through die vias. The third dies are disposed on the second die, and the third dies are bonded to the second through die via. The encapsulant laterally wraps around the third dies.

In some embodiments of the present disclosure, a method for forming a stacking structure is described. A first wafer with a first metallization structure is provided. The first metallization structure includes first through die vias. A second wafer with a second metallization structure is provided. The second metallization structure includes second through die vias. The second wafer is bonded onto the first wafer by bonding the second through die vias respectively with the first through die vias. The second wafer is thinned until ends of the second through die vias are exposed. Third dies are bonded onto the exposed second through die vias of the second wafer. A dicing process is performed to dice the bonded first and second wafers to form the stacking structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacking structure, comprising:
a first die, having a first metallization structure, wherein the first metallization structure includes first through die vias and the first through die vias and the first die have substantially a same height;
a second die, having a second metallization structure, wherein the second die is stacked on the first die, and the second metallization structure includes second through die vias, wherein the first through die vias are bonded with the second through die vias, and critical dimensions of the first through die vias are different from critical dimensions of the second through die vias; and a third die and a fourth die, disposed over the first die and on the second die, wherein the second die is located between the first die and the third and fourth dies, the third and fourth dies are disposed side-by-side, the third and fourth dies have conductive features embedded in a dielectric film and the conductive features of the third and fourth dies are bonded with the second through die vias.

2. The structure of claim 1, wherein the critical dimensions of the first through die vias are smaller than the critical dimensions of the second through die vias.

3. The structure of claim 1, wherein the critical dimensions of the first through die vias are larger than the critical dimensions of the second through die vias.

4. The structure of claim 1, further comprising a bonding film located between the first and second dies, and a hybrid bonding interface is located between the bonding film and a semiconductor substrate of the first die.

5. The structure of claim 1, further comprising a first bonding film and a second bonding film located between the first and second dies, and a hybrid bonding interface is located between the first bonding film and the second bonding film.

6. The structure of claim 1, further comprising a metal bonding pad located between the first and second through die vias.

7. The structure of claim 1, further comprising signal through vias in the first and second dies.

8. The structure of claim 7, wherein the signal through vias in the first die are electrically connected with the signal through vias in the second die through metal bonding pads located there-between.

9. A stacking structure, comprising:

a stack of a first die and a second die, wherein the first die includes first through die vias and the first through die vias and the first die have substantially a same height, the second die stacked on the first die includes second through die vias, wherein the first die is bonded with the second die through a bonding film located between the first and second dies and the first through die vias bonded with the second through die vias, and critical dimensions of the first through die vias are different from critical dimensions of the second through die vias;

third dies disposed on the second die, wherein the second die is located between the first die and the third dies, the third dies have conductive features embedded in a dielectric film and the conductive features of the third dies are bonded to the second through die vias; and an encapsulant, disposed on the second die, disposed between the third dies and laterally wrapping around the third dies.

10. The structure of claim 9, wherein the critical dimensions of the first through die vias are smaller than the critical dimensions of the second through die vias.

11. The structure of claim 9, wherein the critical dimensions of the first through die vias are larger than the critical dimensions of the second through die vias.

12. The structure of claim 9, wherein the bonding film is bonded with a semiconductor substrate of the first die.

13. The structure of claim 9, wherein the bonding film further comprises a first bonding film and a second bonding film located between the first and second dies, and a hybrid bonding interface is located between the first bonding film and the second bonding film.

14. The structure of claim 9, further comprising a metal bonding pad located between the first and second through die vias.

15. The structure of claim 9, further comprising signal through vias in the first and second dies.

16. The structure of claim 9, further comprising a filling material laterally surrounding the stack of the first and second dies.

* * * * *